United States Patent
Kajiyama et al.

[19]

[11] Patent Number: 5,904,301
[45] Date of Patent: May 18, 1999

[54] SPRAYING DEVICE

[75] Inventors: Masaaki Kajiyama, Yokohama; Mitsunao Shibasaki, Ebina, both of Japan

[73] Assignee: Ebara Corporation, Tokyo, Japan

[21] Appl. No.: 08/822,690

[22] Filed: Mar. 24, 1997

[30] Foreign Application Priority Data

Mar. 25, 1996 [JP] Japan .................................. 8-094756

[51] Int. Cl.⁶ .................................................. B05B 1/14
[52] U.S. Cl. .......................... 239/549; 239/565; 239/566
[58] Field of Search .................................. 239/549, 555, 239/566, 112, 565

[56] References Cited

U.S. PATENT DOCUMENTS

| | | | |
|---|---|---|---|
| 1,588,634 | 6/1926 | Wallstrom | 239/112 |
| 2,161,785 | 6/1939 | Lopez | 239/549 X |
| 2,295,522 | 9/1942 | Shorter | 239/549 X |
| 2,501,724 | 3/1950 | Hughey | 239/549 |
| 3,874,599 | 4/1975 | Roger | 239/555 X |
| 4,081,136 | 3/1978 | Addoms et al. | 239/555 X |
| 4,326,553 | 4/1982 | Hall | |
| 4,476,601 | 10/1984 | Oka | |
| 4,791,946 | 12/1988 | Cavanaugh et al. | 239/112 X |

FOREIGN PATENT DOCUMENTS

| | | | |
|---|---|---|---|
| 486650 | 12/1951 | Canada | 239/549 |
| 60-163437 A | 8/1985 | Japan | |
| 855909 | 12/1960 | United Kingdom | 239/555 |

*Primary Examiner*—Kevin Weldon
*Attorney, Agent, or Firm*—Wenderoth, Lind & Ponack, L.L.P.

[57] ABSTRACT

A spraying device for conveniently spraying a plurality of cleaning liquids, e.g., a chemical solution and pure water, over a workpiece, includes sprayer body defining therein a plurality of fluid passages. The fluid passages are separate from each other, and each of the fluid passages is communicated to a respective nozzle portion having a nozzle outlet at a nozzle surface defined on an outer surface of the sprayer body. The nozzle portions communicating each of the different fluid passages have substantially the same distribution in the nozzle surface.

13 Claims, 3 Drawing Sheets

SPRAYING DEVICE

BACKGROUND OF THE INVENTION

1. Field of the Invention

The present invention relates to a spraying device suitable for spraying a plurality of liquids in one direction for use, for example, in cleaning a workpiece such as a semiconductor wafer, a glass substrate, or the like which needs to be cleaned to a high degree of cleanliness.

2. Description of the Prior Art

In the process of fabricating semiconductor wafers, it has been the customary practice to employ various cleaning methods for removing foreign matter such as fine particles of semiconductor materials, dust particles, crystalline protrusions, etc. from the surfaces of semiconductor wafers.

One of such cleaning methods is a scrubbing process as shown in FIG. 6 of the accompanying drawings. According to such scrubbing process, a cleaning liquid is ejected from spraying devices 2 to surfaces of a workpiece 1 such as a semiconductor wafer while at the same time cleaning elements 3 such as brushes, sponges, etc. are rubbing the surfaces of the workpiece 1.

FIG. 7 of the accompanying drawings illustrates the structure of the spraying device 2 in detail. The spraying device 2 comprises a plate-like body 4 having a fluid passage 5 defined therein and a linear array of orifices 6 communicating with the fluid passage 5, orifices 6 being spaced at a predetermined pitch in the longitudinal direction of the fluid passage 5. In use, a cleaning liquid is introduced into the fluid passage 5 and is ejected through the orifices 6.

Since this spraying device 2 can be supplied with only one type of cleaning liquid at a time, if a chemical solution and pure water are to be applied from the spraying device 2 to the same workpiece 1, then the chemical solution and the pure water are introduced alternately into the fluid passage 5. When the chemical solution is introduced into the fluid passage 5, it contaminates the fluid passage 5 and the orifices 6 from which the pure water is to be ejected in a successive cycle. Therefore, it is necessary to wash the residual solution out of the fluid passage 5 and the orifices 6 by subsequently supplying pure water to minimize the possibility of contaminating the workpiece 1, which means that a longer cleaning period is necessary by using the pure water. Even by doing so, it is still difficult to completely remove the remaining chemical solution to null the possibility of contaminating the workpiece 1.

One solution for the above problem is to provide two spraying devices 2 for spraying the chemical solution and the pure water, respectively, positioned above and below the workpiece 1. Such a cleaning system, however, needs a relatively large installation space. It may not be easy to locate one or both of the two spraying devices 2 for spraying the chemical solution and the pure water, respectively, in a region close enough to clean the workpiece 1 efficiently.

SUMMARY OF THE INVENTION

It is therefore an object of the present invention to provide a spraying device capable of supplying a plurality of types of solutions alternately and without contaminating each other.

To achieve the above object, there is provided in accordance with the present invention a spraying device for spraying cleaning liquid over a workpiece comprising: a sprayer body defining therein a plurality of fluid passages, the fluid passages being separate from each other, each of the fluid passages being communicated to a respective nozzle portion having a nozzle outlet at a nozzle surface defined on an outer surface of the sprayer body. The nozzle portions communicate to different of the fluid passages have substantially the same distribution in the nozzle surface.

Different cleaning liquids, e.g., a chemical solution and pure water, are introduced into the fluid passages, respectively, and transferred individually through the fluid passages to be sprayed from the nozzle portions open at the outer surface of the sprayer body. The cleaning liquids can be switched so as to be alternately expelled in one direction from the outer surface of the sprayer body, without being mixed together and without contaminating each other. The sprayer body may comprise a plurality of plates joined to each other for defining therebetween the fluid passages.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
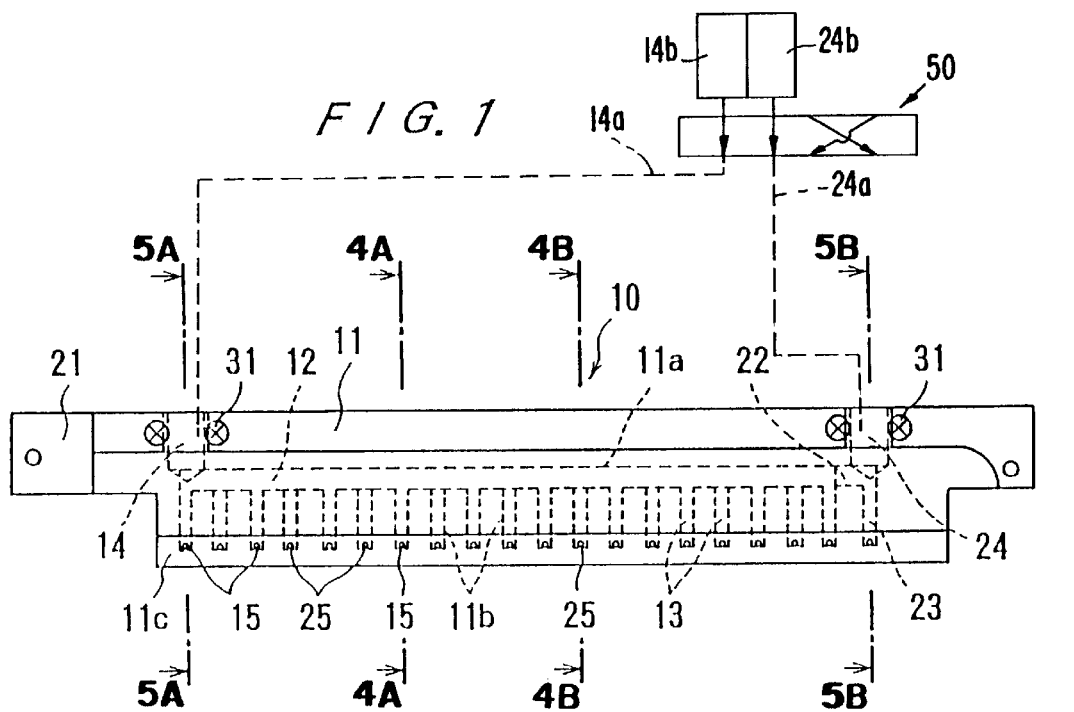
FIG. 1 is a front elevational view of a spraying device according to the present invention.

As shown in FIGS. 1 through 5B, a spraying device 10 according to the present invention comprises two elongate rectangular plates, i.e., a front plate 11 and a rear plate 21, and a flat rectangular partition plate 30. These plates 11, 21 and 30 extend longitudinally in the horizontal direction (a first direction). The plates 11, 21 are bonded to each other in water-tight relation with the partition plate 30 sandwiched therebetween to define two fluid passages on opposite sides of the partition plate 30.

That is, the spraying device 10 has a first reservoir section (first main passage) 12 defined between the front plate 11 and the partition plate 30 and a second reservoir section (second main passage) 22 defined between the rear plate 21 and the partition plate 30. The first reservoir section 12 is in the form of a horizontal groove 11a defined in the front plate 11 and extending in the longitudinal direction of the front plate 11. The second reservoir section 22 is in the form of a horizontal groove 21a defined in the rear plate 21 and extending in the longitudinal direction of the rear plate 21.

A plurality of first fluid passages (first branch passages) 13, horizontally spaced at a predetermined pitch and in parallel relationship to each other, are formed between the front plate 11 and the partition plate 30 to extend vertically (in a second direction) downwardly from the first reservoir section 12. The first fluid passages 13 are in the form of respective vertical grooves 11b defined in the front plate 11 in communication with the horizontal groove 11a.

The first reservoir section 12 and the first fluid passages 13 are formed as follows: The horizontal groove 11a and the vertical grooves 11b communicating therewith are defined in one surface of the front plate 11. Then, the surface of the front plate 11 with the grooves 11a, 11b defined therein is covered with the partition plate 30. The reservoir section 12 and the first fluid passages 13 are thus formed between the front plate 11 and the partition plate 30.

Figure 3:
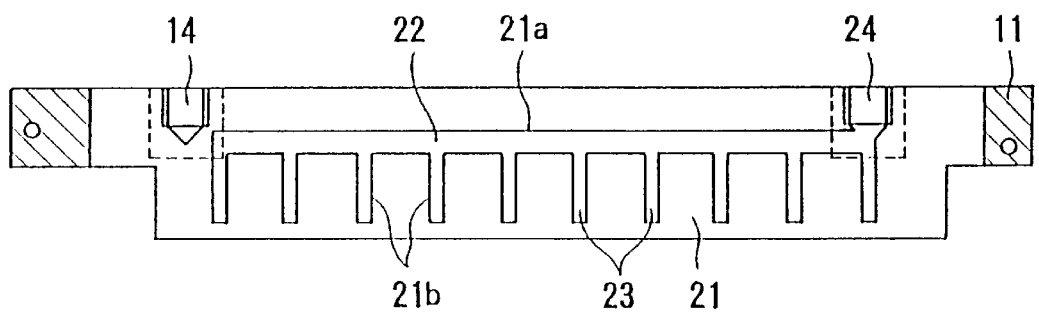
FIG. 3 is a cross-sectional view of the spraying device shown in FIG. 2 along line III.

A plurality of second fluid passages 23, horizontally spaced at a predetermined pitch in parallel relationship to each other, are also formed between the rear plate 21 and the partition plate 30 to extend vertically downwardly from the second reservoir section 22. The second fluid passages 23 are in the form of respective vertical grooves 21b defined in the rear plate 21 in communication with the horizontal groove 21a, as shown in FIG. 3. The second reservoir section 22 and the second fluid passages 23 are formed in the same manner as the first reservoir section 12 and the first fluid passages 13 as described above.

Figure 2:
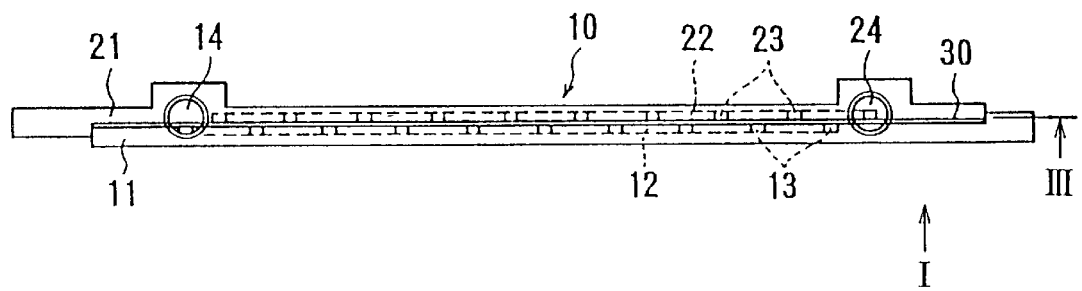
FIG. 2 is a plan view of the spraying device shown in FIG. 1.

The first and second fluid passages 13, 23 are positioned alternately with each other in the longitudinal direction of the spraying device 10, such that any adjacent two of these fluid passages are first and second fluid passages 13, 23, as shown in FIGS. 1 and 2.

Figure 4A:
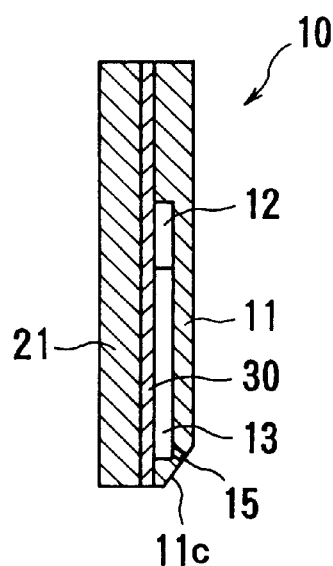
FIG. 4A is a cross-sectional view taken along line 4A—4A of FIG. 1.
Figure 4B:
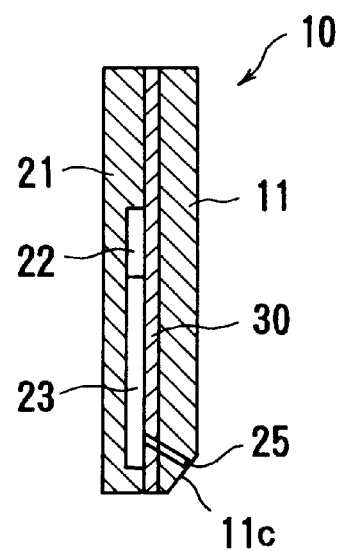
FIG. 4B is a cross-sectional view taken along line 4B—4B of FIG. 1.
Figure 6:
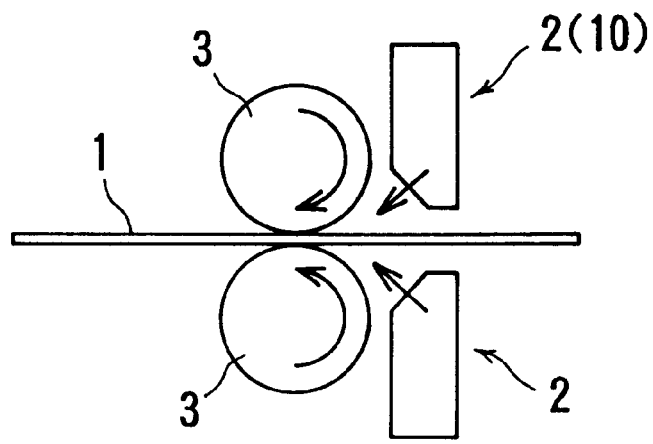
FIG. 6 is a side elevational view of spraying arrangement that can include the device of the invention.
Figure 7:
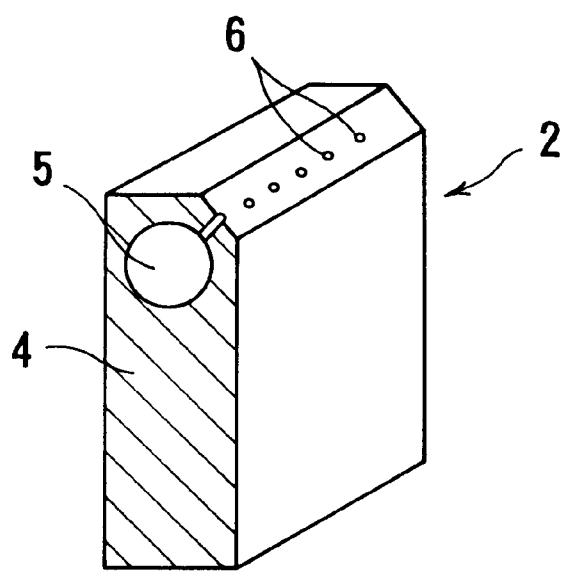
FIG. 7 is a perspective view of a conventional spraying device shown in FIG. 6.

As shown in FIGS. 4A and 4B, which show an upper spraying device 10 to be arranged above a workpiece, e.g. the workpiece 1 in FIG. 6, the front plate 11 has a slanted or inclined surface (nozzle surface) 11c at its bottom extending along a lower longitudinal edge thereof. First orifices (nozzle portions) 15 are formed in the front plate 11 for each of the first fluid passages 13 to have respective outlets opening at the slanted surface 11c and respective inner ends communicating with the respective lower ends of the first fluid passages 13. Second orifices (nozzle portions) 25 are formed in the partition plate 30 and the front plate 11 for each of the second fluid passages 23 to have respective outlets opening also at the slanted surface 11c. The second orifices 25 have respective inner ends communicating with the respective lower ends of the second fluid passages 23. The outlets of the first and second orifices 15, 25 are positioned substantially in a horizontal alignment with each other along the slanted surface 11c.

Because the first and second fluid passages 13, 23 are alternately positioned in the longitudinal direction of the spraying device 10, as described above, the first and second orifices 15, 25 are also alternately positioned in the longitudinal direction of the spraying device 10, as shown in FIG. 1. The first orifices 15 can be formed by drilling the front plate 11 from the slanted surface 11c to the lower ends of the first fluid passages 13, and the second orifices 25 can be formed by drilling the front plate 11 and the partition plate 30 from the slanted surface 11c to the lower ends of the second fluid passages 23. The first and second orifices 15, 25 have their axes oriented at substantially the same angle with respect to the slanted surface 11c.

Figure 5A:
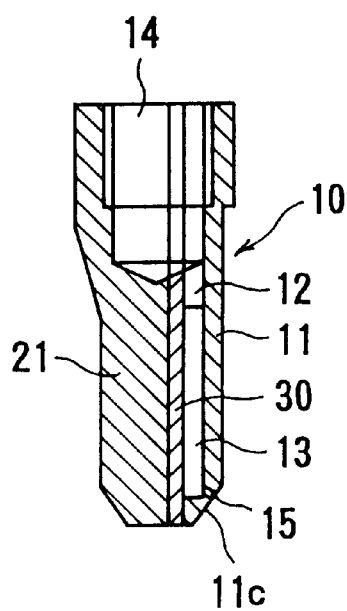
FIG. 5A is a cross-sectional view taken along line 5C—5C of FIG. 1.
Figure 5B:
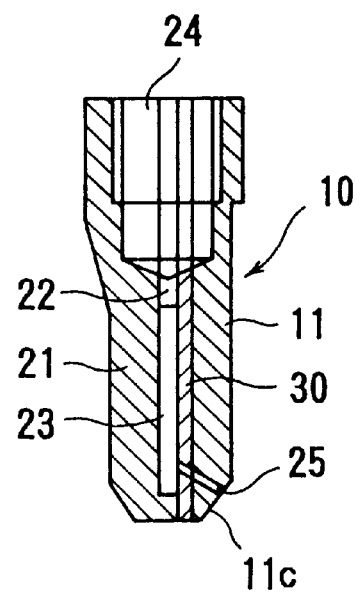
FIG. 5B is a cross-sectional view taken along line 5D—5D of FIG. 1.

The spraying device 10 also has two vertical inlet ports 14, 24 defined in respective opposite ends for introducing different cleaning liquids. The inlet port 14 has an upper end opening at the upper surface of the spraying device 10 and a lower end that communicates only with the first reservoir section 12 at one longitudinal end thereof, as shown in FIG. 5A. The inlet port 24 has an upper end opening at the upper surface of the spraying device 10 and a lower end that communicates only with the second reservoir section 22 at one longitudinal end thereof, as shown in FIG. 5B.

The inlet ports 14, 24 are formed by drilling or otherwise machining the front plate 11, partition plate 30 and rear plate 21 after they have been bonded to each other. Screws 31 are threaded transversely into the plates 11, 21 and 30 on both sides of the inlet ports 14, 24 for thereby integrally joining the plates 11, 21 and the partition plate 30. The screws 31 are threaded so that their head surfaces are flush with the outer surface of the front plate 11 to prevent their tips from projecting out of the outer surface of the rear plate 21.

The inlet port 14, the first reservoir section 12, the first fluid passages 13, and the first orifices 15 jointly make up a first fluid supply line, and the inlet port 24, the second reservoir section 22, the second fluid passages 23, and the second orifices 25 jointly make up a second fluid supply line. These first and second fluid supply lines are separate from each other, i.e., do not communicate with each other. The first and second orifices 15, 25 are in substantially the same plane which is slanted or inclined relative to the vertical direction, and therefore, the outer openings thereof are aligned in a substantially straight line on the slanted surface 11c. Thus, the first and second orifices 15, 25 eject liquid substantially in the same direction to supply it at aligned locations on the workpiece 1.

Operation of the spraying device 10 will be described below. Ends of tubes, shown schematically at 14a and 24a in FIG. 1, extend from sources 14b and 24b of different cleaning liquids, such as acid- or alkaline-chemical solutions, surfactant and/or pure water, by way of a switching valves, shown schematically at 50 (not shown) are connected respectively to the inlet ports 14, 24. Then, the spraying device 10 is adjusted to a position, as shown in FIG. 6, so as to direct the orifices 15, 25 toward a certain region to be cleaned of the workpiece 1.

When it is necessary to use a chemical solution and pure water to wash the workpiece 1 sequentially, first, the chemical solution is transferred through the first fluid supply line, for example, and is ejected from the first orifices 15 to be supplied on the workpiece 1. This is conducted by operating switching valve to communicate the chemical solution source through the inlet port 14 with the spraying device 10. Then, the first washing step is finished, the pure water is transferred from the other source through the second fluid supply line by operating the switching valve to switch the connection of supply sources. Once the source is switched, only the pure water is supplied to the workpiece 1 from the spraying device. Therefore, there is no need for cleaning the fluid supply line itself so that the cleaning operation can be conducted in a relatively short period of time. Since both the orifices 15, 25 are positioned on the spraying device 10 toward a desired region of the workpiece 1, it is not necessary to adjust the location or direction of the orifices 15, 25. As a result, the workpiece 1 is cleaned efficiently.

The first and second reservoir sections 12, 22 and the first and second fluid passages 13, 23 are defined between the plates 11, 21 and the partition plate 30 when the plates 11, 21 and the partition plate 30 are assembled together. Consequently, these reservoir sections and fluid passages, which make up relatively complex fluid supply lines, can easily be manufactured relatively inexpensively. Furthermore, the reservoir sections and fluid passages can also easily be serviced for maintenance relatively inexpensively.

Although a certain preferred embodiment of the present invention has been shown and described in detail, it should be understood that various changes and modifications may be made thereto without departing from the scope of the appended claims. In the above embodiment, a spraying device having two fluid supply lines is described, however, it is possible to provide more than three fluid supply lines in a spraying device. A spraying device having three fluid supply lines can be constructed by, for example, stacking four plates. Further, in the above embodiment, outlets of the orifices are arranged in a line, i.e., one-dimensionally, it is also possible to arrange the orifices uniformly in the outer surface of the sprayer body two-dimensionally. Further, in the above-description the spraying device is used to spray two different kinds of cleaning liquids over a workpiece, but the use of the device is not limited to such usage. The device can be used as a supplying device for various kinds of liquids such as a polishing solution, a dilution liquid, pure water, a dressing liquid, and/or pH regulator. It is also possible to use the device so as to eject liquids of different or the same kind from the different fluid passages simultaneously for the purpose of adjusting concentration, for example. The device can also be used for supplying gaseous fluid such as inert or reactive gas, or mist.

What is claimed is:

1. A cleaning apparatus for cleaning a semiconductor wafer, said apparatus comprising a holder for supporting a semiconductor wafer to be cleaned, a cleaning element to be rubbed against a surface of the semiconductor wafer, and a spraying device for spraying cleaning fluids onto the semiconductor wafer, said spraying device comprising:

a plurality of rectangular plates joined together to form a body, said plurality of rectangular plates defining therebetween a fluid passage system within said body, said body having at an end thereof a nozzle surface, and said fluid passage system including plural fluid supply lines;

each said fluid supply line including a main fluid passage extending in said body in a first direction, and a plurality of branch fluid passages branching from said main fluid passage, said plurality of branch fluid passages being equidistantly spaced along said main fluid passage in said first direction, and each said branch fluid passage extending in a second direction substantially perpendicular to said first direction and including a nozzle portion opening at said nozzle surface; and said nozzle portions of said branch fluid passages of different of said fluid supply lines opening at said nozzle surface in an alternating arrangement in said first direction.

2. An apparatus as claimed in claim 1, wherein said main fluid passage and said branch fluid passages of each said fluid supply line are formed by grooves in a respective said rectangular plate.

3. An apparatus as claimed in claim 2, further comprising a partition plate member covering said grooves.

4. An apparatus as claimed in claim 3, wherein said nozzle portions of a first said fluid supply line comprise holes formed through a first said rectangular plate, and said nozzle portions of a second said fluid supply line comprise holes formed through said first rectangular plate and through said partition plate.

5. An apparatus as claimed in claim 2, wherein said branch fluid passages of different of said fluid supply lines are arranged alternately in said first direction.

6. An apparatus as claimed in claim 1, wherein said branch fluid passages of different of said fluid supply lines are arranged alternately in said first direction.

7. An apparatus as claimed in claim 1, wherein each said nozzle portion comprises an orifice in said nozzle surface.

8. An apparatus as claimed in claim 1, wherein said nozzle surface comprises a planar surface of said body.

9. An apparatus as claimed in claim 1, wherein said nozzle surface is inclined relative to said second direction.

10. An apparatus as claimed in claim 1, wherein said rectangular plates are joined by bonding.

11. An apparatus as claimed in claim 1, further comprising a cleaning fluid supply device for selectively supplying different cleaning fluids to respective of said main fluid passages.

12. An apparatus as claimed in claim 11, wherein said cleaning fluid supply device includes a switching device for sequentially switching supply of the different cleaning fluids to said main fluid passages.

13. An apparatus as claimed in claim 11, wherein said cleaning fluid supply device is operable to supply the different cleaning fluids simultaneously to said respective main fluid passages.

* * * * *